(12) United States Patent
Arai

(10) Patent No.: US 7,893,681 B2
(45) Date of Patent: Feb. 22, 2011

(54) ELECTRONIC CIRCUIT

(75) Inventor: Kenji Arai, Kanagawa (JP)

(73) Assignee: Spansion LLC, Sunnyvale, CA (US)

( * ) Notice: Subject to any disclaimer, the term of this patent is extended or adjusted under 35 U.S.C. 154(b) by 206 days.

(21) Appl. No.: 12/334,221

(22) Filed: Dec. 12, 2008

(65) Prior Publication Data
US 2009/0153125 A1 Jun. 18, 2009

(30) Foreign Application Priority Data
Dec. 13, 2007 (JP) ............... 2007-322071

(51) Int. Cl.
*G05F 3/16* (2006.01)
*G05F 3/20* (2006.01)
(52) U.S. Cl. ...................... 323/313; 323/315
(58) Field of Classification Search .......... 323/313–316
See application file for complete search history.

(56) References Cited
U.S. PATENT DOCUMENTS
5,646,518 A * 7/1997 Lakshmikumar et al. .... 323/316
6,150,872 A * 11/2000 McNeill et al. ............. 323/313
6,225,856 B1 * 5/2001 Toth ........................ 323/315
7,030,598 B1 * 4/2006 Dow ........................ 323/313
2005/0093531 A1 * 5/2005 Vorenkamp et al. ......... 323/316

* cited by examiner

*Primary Examiner*—Bao Q Vu
*Assistant Examiner*—Jue Zhang

(57) ABSTRACT

An electronic circuit is disclosed. The electronic circuit includes a bandgap circuit provided with first and second bipolar transistors that are coupled at a first node and a current mirror circuit provided with third and fourth transistors with respective control terminals coupled at a second node. The electronic circuit further includes a fifth transistor that is bipolar which is coupled to an output terminal of the third transistor where a base of the fifth transistor is coupled to a collector of the second transistor and a sixth transistor that is bipolar that is coupled to an output terminal of the fourth transistor with a base of the sixth transistor coupled to the first node. A control circuit controls a current provided to the bandgap circuit based on an output of the current mirror circuit. A reference voltage output terminal is provided between the control circuit and the bandgap circuit and outputs a reference voltage.

20 Claims, 6 Drawing Sheets

(a)

(b)

ELECTRONIC CIRCUIT

RELATED APPLICATIONS

This Application claims priority to Japanese Patent Application 2007-322071 entitled "Electronic Circuit" filed Dec. 13, 2007 which is incorporated herein in its entirety.

TECHNICAL FIELD

The present invention relates to electronic circuits and, more particularly, to an electronic circuit that includes a bandgap reference circuit and a current mirror circuit.

BACKGROUND ART

Conventional electronic circuits that are used to output a reference are well known. One such type of circuit which adds a voltage having a negative voltage dependency and a voltage having a positive voltage dependency to produce a reference voltage of a small temperature dependency is referred to as a bandgap circuit. Japanese Patent Application Publication No. JP-A-11-95850 discloses an electronic circuit provided with a reference voltage output terminal between a control transistor and a bandgap circuit, having a feedback from the bandgap circuit that is provided to the control transistor.

According to JP-A-11-95850, through operation of the bandgap circuit, a reference voltage of a small temperature dependency is obtainable. In addition, because of the feedback from the bandgap circuit to the control transistor, a reference voltage having reduced power supply voltage dependency is obtainable. However, even in a case such as is disclosed in JP-A-11-95850, the suppression of temperature dependency and power supply voltage dependency of the reference voltage is not sufficient for many applications.

SUMMARY

In order to solve the problem mentioned above, it is an object of the present invention to provide an electronic circuit which allows the temperature dependency and power supply voltage dependency of a reference voltage to be suppressed.

In one embodiment, the electronic circuit includes a bandgap circuit provided with first and second bipolar transistors that are coupled at a first node and a current mirror circuit provided with third and fourth transistors that have respective control terminals that are coupled at a second node. The electronic circuit further includes a fifth transistor that is bipolar which is coupled to an output terminal of the third transistor where a base of the fifth transistor is coupled to a collector of the second transistor and a sixth transistor that is bipolar that is coupled to an output terminal of the fourth transistor with a base of the sixth transistor coupled to the first node. A control circuit controls a current provided to the bandgap circuit based on an output of the current mirror circuit. A reference voltage output terminal is provided between the control circuit and the bandgap circuit and outputs a reference voltage whose temperature and power supply dependency is suppressed.

BRIEF DESCRIPTION OF THE DRAWINGS

The accompanying drawings, which are incorporated in and form a part of this specification, illustrate embodiments and, together with the description, serve to explain the principles of the embodiments.

The drawings referred to in this description should not be understood as being drawn to scale except if specifically noted.

DETAILED DESCRIPTION

Reference will now be made in detail to various embodiments, examples of which are illustrated in the accompanying drawings. While descriptions will be provided in conjunction with these embodiments, it will be understood that the descriptions are not intended to limit the scope of the embodiments. On the contrary, the disclosure is intended to cover alternatives, modifications and equivalents, of these embodiments. Furthermore, in the following description, numerous specific details are set forth in order to provide a thorough understanding of embodiments. In other instances, well-known methods, procedures, components, and circuits have not been described in detail as not to unnecessarily obscure aspects of embodiments.

Figure 1:
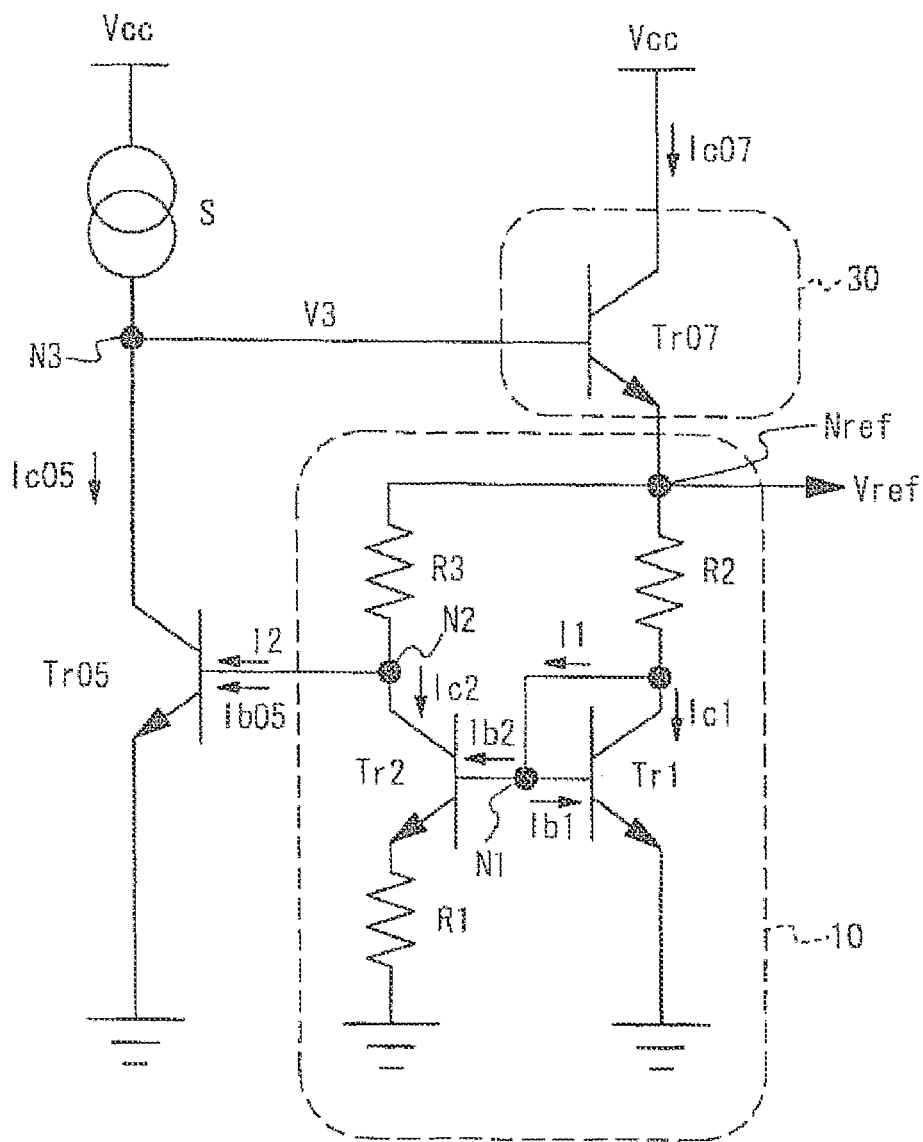
FIG. 1 is a schematic circuit diagram of an electronic circuit of a first comparative example.

First, as a first comparative example, a reference voltage circuit schematically representing the circuit disclosed in JP-A-11-95850 will be described. FIG. 1 is a schematic circuit diagram of an electronic circuit of the first comparative example. With reference to FIG. 1, the electronic circuit of the first comparative example has a bandgap circuit 10 that has a small temperature dependency, a control circuit 30 for controlling the current that is provided to the bandgap circuit 10, a current source S, and an NPN bipolar transistor Tr05.

The bandgap circuit 10 has a first transistor Tr1, a second transistor Tr2, a first resistor R1, a second resistor R2, and a third resistor R3. The first transistor Tr1 and the second transistor Tr2 are NPN bipolar transistors, and respective bases thereof are coupled with each other at a first node N1. The collector of the first transistor Tr1 is coupled to a reference voltage output terminal Nref with the second resistor R2 therebetween, and the emitter thereof is grounded. The collector of the first transistor Tr1 is also coupled to the base thereof directly. The collector of the second transistor Tr2 is coupled to the reference voltage output terminal Nref with the third resistor R3 therebetween, and the emitter thereof grounded with the first resistor R1 therebetween. The node between the collector of the second transistor Tr2 and the third resistor R3 is a second node N2.

The base of the NPN bipolar transistor Tr05 is coupled to the second node N2, the emitter thereof is grounded, and the collector thereof is coupled to the current source S. The node between the collector of the transistor Tr05 and the current source S is a third node N3. The control circuit 30 is coupled between the reference voltage output terminal Nref and a power supply Vcc. The control circuit 30 includes an NPN bipolar transistor Tr07. The base of the transistor Tr07 is coupled to the third node N3, the collector thereof to the power supply Vcc, and the emitter thereof to the reference voltage output terminal Nref.

Now, the function of the bandgap circuit 10 in outputting a reference voltage of a small temperature dependency will be described below. Here, the first transistor Tr1 and the second transistor Tr2 have the same hfe, and the ratio of the emitter area of the second transistor Tr2 to the emitter area of the first transistor Tr1 is defined as n4. It is preferable that the ratio n4 of the emitter areas is set, while taking a voltage drop across the first resistor R1 into account, as the base current Ib1 of the first transistor Tr1 and the base current Ib2 of the second transistor Tr2 are the same.

Figure 2A:
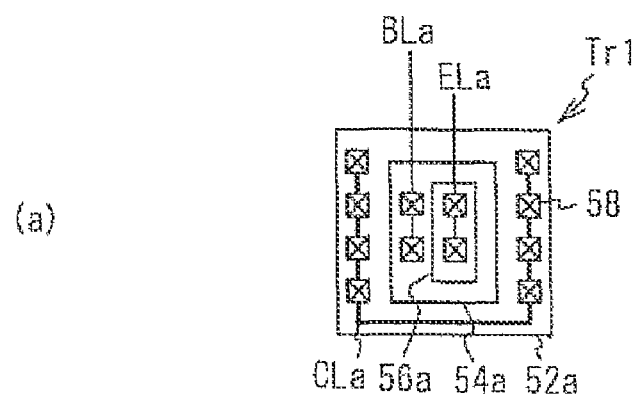
FIG. 2A schematically illustrates a first transistor.
Figure 2B:
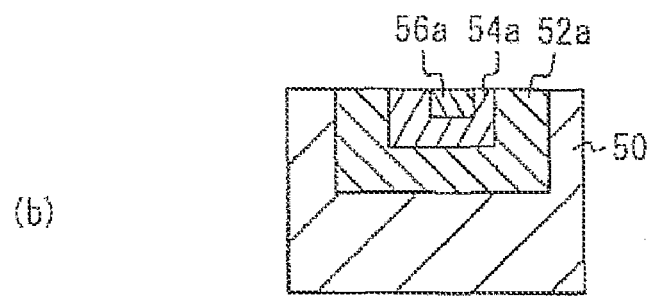
FIG. 2B schematically illustrates a first transistor

The second transistor Tr2 is coupled in parallel with a plurality of transistors having the same configuration as that of the first transistor Tr1. FIG. 2A is a top view of the first transistor Tr1, and FIG. 2B is a cross-sectional view thereof. With reference to FIGS. 2A and 2B, in a p-type silicon substrate 50, an n-type collector region 52a is formed. In a collector region 52a, a p-type base region 54a is formed and, in the base region 54a, an n-type emitter region 56a is formed. The collector region 52a, the base region 54a, and the emitter region 56a are respectively coupled to interconnections CLa, BLa and ELa via connection sections 58.

Figure 3A:
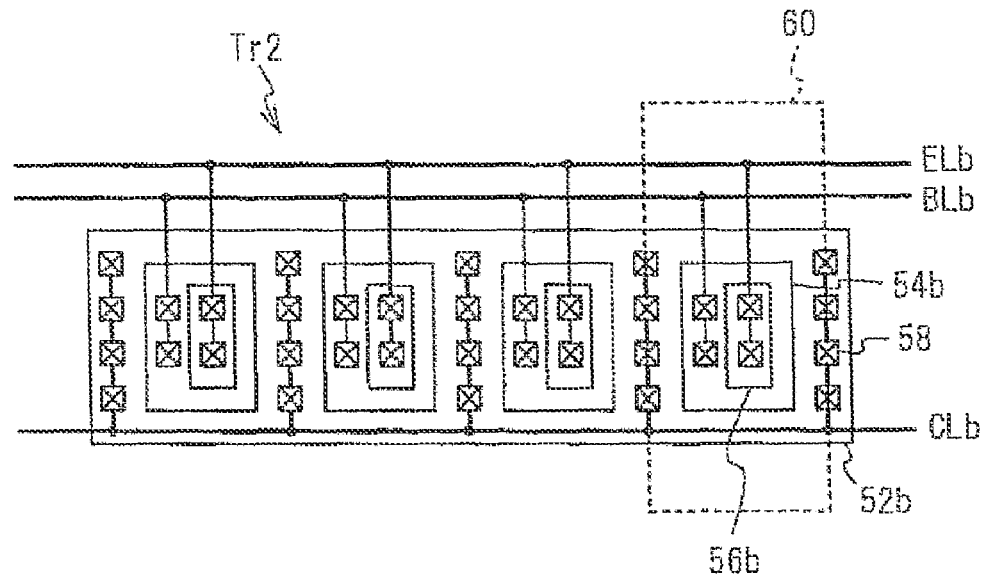
FIG. 3A schematically illustrates a second transistor.
Figure 3B:
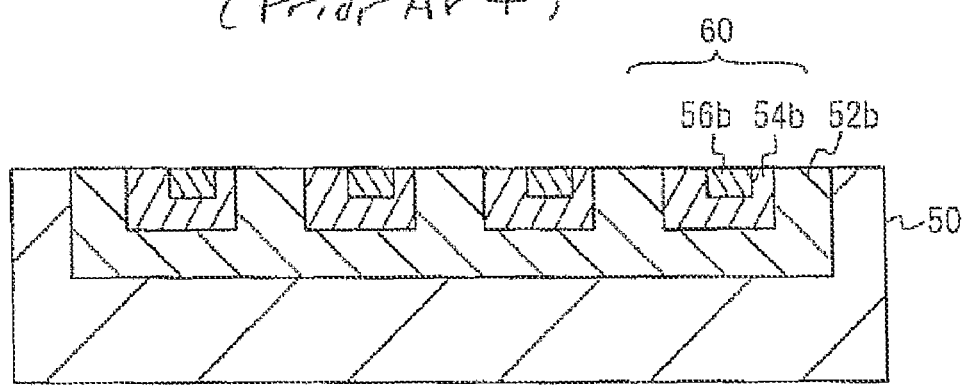
FIG. 3B schematically illustrates a second transistor.

FIG. 3A is a top view of the second transistor Tr2, and FIG. 3B is a cross-sectional view thereof. With reference to FIGS. 3A and 3B, in the second transistor Tr2, a plurality of base regions 54b are formed in a collector region 52b and, in each of the plurality of base regions 54b, a respective emitter region 56b is formed. The collector region 52b, the base regions 54b, and the emitter regions 56b are respectively coupled with interconnections CLb, BLb and ELb via the connection sections 58. As just described, the second transistor Tr2 is coupled in parallel with a plurality of transistors 60. Each of the transistors 60 has the same configuration as that of the first transistor Tr1. More specifically, the respective emitter areas and base areas viewed from the top are nearly the same as those of the first transistor Tr1. In addition, since the first transistor Tr1 and the second transistor Tr2 are fabricated in the same manufacturing process, cross-sectional shapes of the emitter regions and the base regions are nearly the same and the impurity concentration thereof are also nearly the same. Consequently, the Early effects of the first transistor Tr1 and the second transistor Tr2 can be matched. In FIG. 1, the second transistor Tr2 is represented by a single transistor symbol for the sake of simplicity.

The reference voltage Vref output from the reference voltage output terminal Nref is represented by Equation 1:

$$Vref = Vbe1 + Vr2 \quad \text{Equation 1}$$

where Vr2 is a voltage difference between both ends of the second resistor R2 and is represented by Equation 2:

$$Vr2 = (R2/R1)(KT/q)\ln(n4) \quad \text{Equation 2}$$

where R1 and R2 are respective resistance values of the first resistor R1 and the second resistor R2, K is the Boltzmann's constant, T is the temperature in K, and q is the charge amount of an electron.

The base-emitter voltage Vbe1 of the first transistor Tr1 has a negative temperature coefficient. Conversely, according to Equation 2, Vr2 has a positive temperature coefficient. As just described, the temperature coefficients of Vbe1 and Vr2 are of opposite polarity to each other. Therefore, the respective resistance values of the first resistor R1 and the second resistor R2 are adjusted so as to make the absolute value of the temperature coefficient of Vbe1 and the absolute value of the temperature coefficient of Vr2 to be nearly the same. For example, the temperature coefficient of the Vbe1 is typically −2 mV/Celsius. Therefore, the R1 and R2 are adjusted so as to make the temperature coefficient of Vr2 become 2 mV/Celsius. Consequently, the Vbe1 and the Vr2 in Equation 1 negate the temperature dependencies against each other, thereby making the temperature dependency of the reference voltage Vref small.

However, with the bandgap circuit 10 alone, the reference voltage Vref fluctuates, for example, when the power supply voltage Vcc fluctuates. Therefore, in the first comparative example, with transistor Tr05, by feeding back the voltage at the second node N2 to the control circuit 30, the fluctuation of the reference voltage Vref is suppressed. When the power supply voltage Vcc rises, the reference voltage Vref also rises. This makes the voltage at the second node N2 rise, thereby raising the base voltage of the transistor Tr05. Thus, the collector current Ic05 of the transistor Tr05 is increased, making the voltage V3 of the third node N3 drop. Therefore, the collector current Ic07 of the transistor Tr07 is reduced, thereby lowering the reference voltage Vref. Consequently, the dependency of the reference voltage Vref to the power supply voltage Vcc is decreased.

In the first comparative example, in order to suppress the temperature dependency of the reference voltage Vref, it is preferable that the base current Ib05 of the transistor Tr05 be equal as the base current Ib1 of the first transistor Tr1 and the base current Ib2 of the second transistor Tr2. It is for this reason that when the base current Ib differs, the temperature characteristics of each of the transistors becomes different. Here, a preferable relationship between the collector current Ic1 of the first transistor Tr1 and the collector current Ic05 of the transistor Tr05 will be described. In order to make the temperature characteristics of the first transistor Tr1 and the second transistor Tr2 equal, in FIG. 1, it is desirable that the collector current Ic1 of the first transistor Tr1 and the collector current Ic2 of the second transistor Tr2 be equal. While the emitter area of the second transistor Tr2 is n4 times that of the first transistor Tr1, the base current Ib1 of the first transistor Tr1 and the base current Ib2 of the second transistor Tr2 are set to be the same. Therefore, the collector currents Ic1 and the Ic2 become the same. Furthermore, so as to make the current I1 and the current I2 equal, the emitter area of the transistor Tr05 is designed to be n2 times that of the first transistor Tr1. Consequently, the collector current Ic05 of the transistor Tr05 is provided by n2×Ic1.

As described above, even though the preferable current value of the collector current Ic05 of the transistor Tr05 is defined, the magnitude of the collector current Ic05 of the first comparative example is determined by the current source S. Therefore, when the current output from the current source S differs from the preferable collector current Ic05, each of the transistors is off-balanced, thereby making the base-emitter voltage Vbe of each of the transistors different. Consequently, there has been a problem in that the temperature dependency of the reference voltage becomes large. Embodiments of the present invention to solve the problem mentioned above will be described, below.

Figure 4:
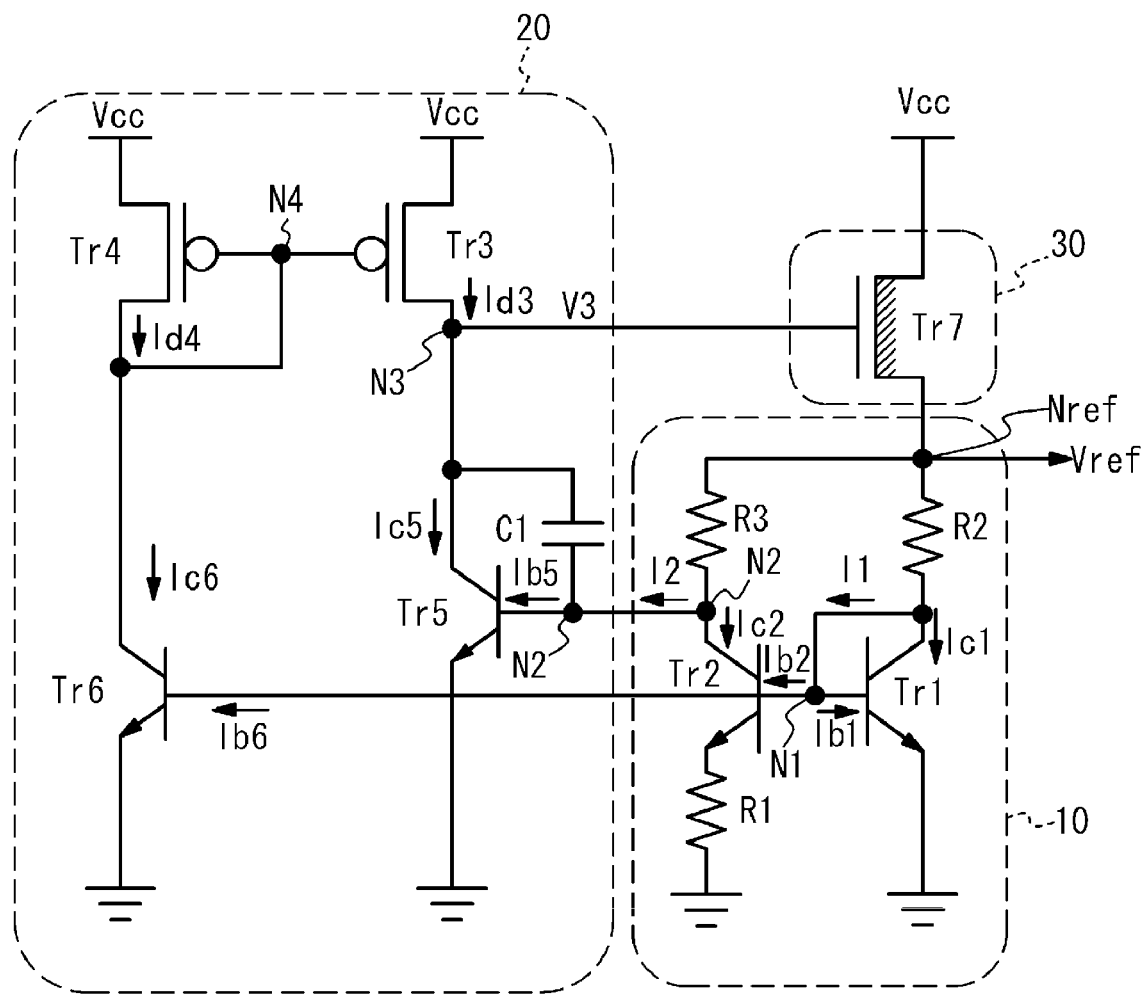
FIG. 4 is a schematic circuit diagram of an electronic circuit of a first embodiment of the present invention.

FIG. 4 is a schematic circuit diagram of an electronic circuit of a first embodiment of the present invention. With reference to FIG. 4, the electronic circuit of the first embodiment has a bandgap circuit 10, a current mirror circuit 20, and a control circuit 30. The structure of the bandgap circuit 10 is the same as that of the first comparative example, thus the description thereof is omitted.

The current mirror circuit 20 has a third transistor Tr3, a fourth transistor Tr4, a fifth transistor Tr5, a sixth transistor Tr6, and a capacitor C1. The third transistor Tr3 and the fourth transistor Tr4 are p-type MOSFETs, and the fifth transistor Tr5 and the sixth transistor Tr6 are NPN type bipolar transistors. At a fourth node N4, the respective gates, i.e. control terminals, of the third transistor Tr3 and the fourth transistor Tr4 are coupled. The sources of the third transistor Tr3 and the fourth transistor Tr4 are coupled to the power supply Vcc. The drain of the third transistor Tr3 is coupled to the collector of the fifth transistor Tr5 via the third node N3. The drain of the fourth transistor Tr4 is coupled with the fourth node N4 and the collector of the sixth transistor Tr6. The ratio of the gate width of the third transistor Tr3 to the gate width of the fourth transistor Tr4 is defined as n3. Consequently, the output current, i.e. drain current, of the third transistor Tr3 becomes n3 times that of the fourth transistor Tr4.

The collector of the fifth transistor Tr5 is coupled to the drain, i.e. output terminal, of the third transistor Tr3, the base thereof is coupled to the second node N2, and the emitter thereof is grounded. Between the base and the collector thereof, a capacitor C1 for phase adjusting is coupled in parallel. The ratio of the emitter area of the fifth transistor Tr5 to the emitter area of the first transistor Tr1 is defined as n2. The collector of the sixth transistor Tr6 is coupled to the drain, i.e. output terminal, of the fourth transistor Tr4, the base thereof is coupled to the first node N1, and the emitter thereof is grounded. The ratio of the emitter area of the sixth transistor Tr6 to the emitter area of the first transistor Tr1 is defined as n1.

The control circuit 30 has a seventh transistor Tr7 that is a normally-on n-type MOSFET. The drain of the seventh transistor Tr7 is coupled to the power supply Vcc, the gate thereof, i.e. control terminal, is coupled to the third node N3, i.e. output terminal of the third transistor Tr3, and the source thereof is coupled to the reference voltage output terminal Nref. The control circuit 30 controls, based on the output V3 of the current mirror circuit 20, i.e. voltage at the third node, the current provided from the power supply Vcc to the bandgap circuit 10.

In a comparison between the first embodiment and the first comparative example, while the collector current Ic05 of the transistor Tr05 is being provided from the current source S in the first comparative example, the collector current Ic5 of the fifth transistor Tr5 is provided from the drain of the third transistor Tr3 in the current mirror circuit 20 in the first embodiment. The ratio of the gate widths between the third transistor Tr3 and the fourth transistor Tr4 of the current mirror circuit 20 is set to a predefined value, and the ratio of the emitter areas between the sixth transistor Tr6 and the first transistor Tr1 is set to a predefined value. Consequently, the collector current Ic5 of the fifth transistor Tr5 to the collector current Ic1 of the first transistor Tr1 can be set to a desired value.

In the first embodiment, the emitter area of the fifth transistor Tr5 is n2 times that of the first transistor Tr1. Therefore, in order to make the base current Ib1 of the first transistor Tr1 and the base current Ib5 of the fifth transistor Tr5 equal, it is preferable that the collector current Ic5 of the fifth transistor Tr5 is to be equal to n2×Ic1. Meanwhile, the emitter area of the sixth transistor Tr6 is n1 times the emitter area of the first transistor Tr1. Therefore, the collector current Ic6 of the sixth transistor Tr6 is equal to n1×Ic1. The collector current Ic6 is identical to the drain current Id4 of the fourth transistor Tr4. The gate width of the third transistor Tr3 is n3 times that of the fourth transistor Tr4. Therefore, the collector current Ic5 is given by Ic5=n3×Ic6=n1×n3×Ic1. Consequently, by making n2=n1×n3, the current provided to the collector current Ic5 of the fifth transistor Tr5 can be set as n2 times the collector current Ic1 of the first transistor Tr1. Therefore, by operation of the current mirror circuit 20, without the need of adjusting the current value provided by the current source S as in the case of the first comparative example, the current provided to the fifth transistor Tr5 can be set to the desired value.

In order to make the temperature characteristics of the first transistor Tr1 and the second transistor Tr2 be the same, the collector current Ic1 of the first transistor Tr1 and the collector current Ic2 of the second transistor Tr2 are set the same. Therefore, Equation 3 is defined as:

$$Ic1=Ic2 \qquad \text{Equation 3}$$

Meanwhile, the emitter area of the sixth transistor Tr6 is n1 times the emitter area of the first transistor Tr1. Therefore, Equation 4 is defined as:

$$Ic6=n1 \times Ic1 \qquad \text{Equation 4}$$

The gate width of the third transistor Tr3 is n3 times that of the fourth transistor Tr4. The emitter area of the fifth transistor Tr5 is n2 times that of the first transistor Tr1. Therefore, Equations 5 and 6 are defined as:

$$Ic5=n3 \times Ic6 \qquad \text{Equation 5}$$

$$Ic5=n2 \times Ic1 \qquad \text{Equation 6}$$

Based on Equations 4, 5, and 6, it is preferable that n2=n1×n3.

While the seventh transistor Tr7 may be a bipolar transistor as in the first comparative example or a normally-off FET, it is preferable to be a normally-on FET. The reason for this will be described below. When setting the reference voltage Vref to a voltage close to the power supply voltage Vcc, while a bipolar transistor or a normally-off FET is used as the transistor for the control circuit 30, the following problem will arise. More specifically, in this case, the voltage V3 of the third node N3 becomes higher than the reference voltage Vref. Therefore, the third transistor Tr3 and the fourth transistor Tr4 are used in a non-saturating region. In a non-saturating region, the dependency of the drain current to the drain voltage is large, thereby lowering the accuracy of the output current of the current mirror circuit 20. Consequently, the accuracy of the reference voltage Vref deteriorates.

According to the first embodiment, a normally-on MOSFET is used as the seventh transistor Tr7 of the control circuit 30. Therefore, the voltage V3 of the third node N3 can be made low. Consequently, the third transistor Tr3 and the fourth transistor Tr4 can be used in a saturating region. In a saturating region, the dependency of the drain current to the drain voltage is small, thereby improving the accuracy of the output current of the current mirror circuit 20. Consequently, the accuracy of the reference voltage Vref can be improved.

Figure 5:
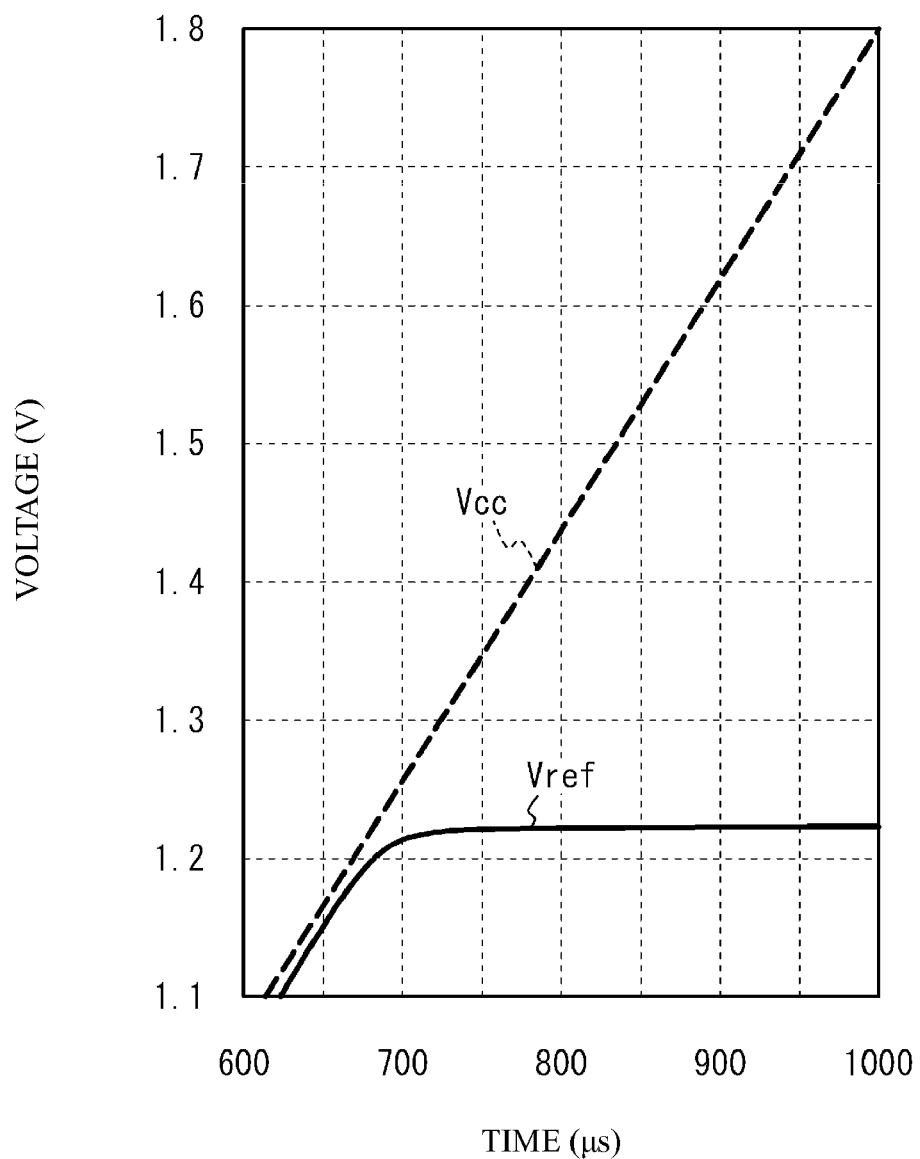
FIG. 5 shows a measurement result of the first embodiment.
Figure 6:
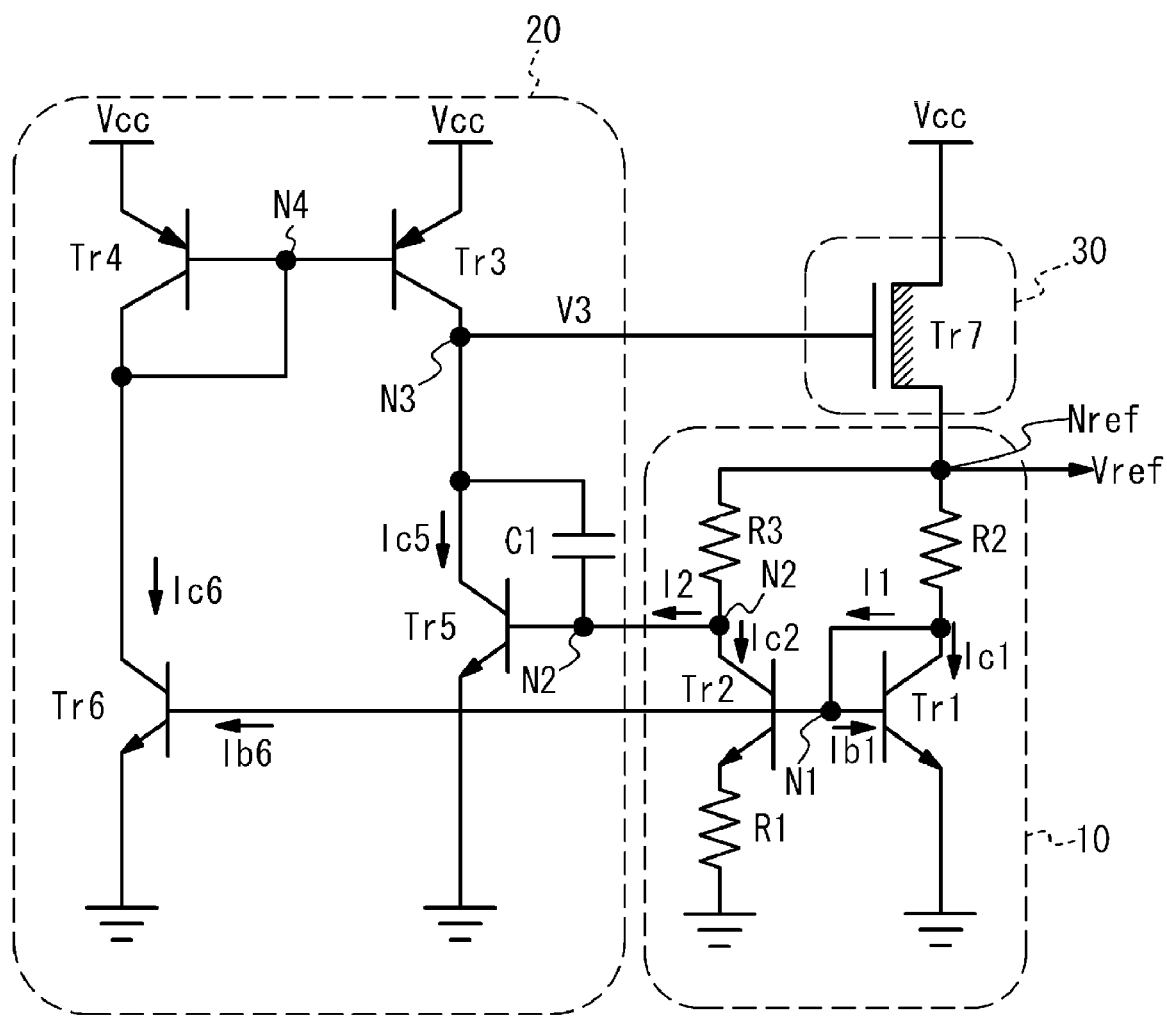
FIG. 6 is a schematic circuit diagram of an electronic circuit of a second embodiment.

FIG. 5 shows a graph of the reference voltage Vref and the power supply voltage Vcc of the electronic circuit of the first embodiment. The horizontal axis indicates time, and the power supply voltage Vcc is linearly changed with respect to time. Up to the power supply voltage Vcc of 1.2 V, the reference voltage Vref is nearly the same value as the power supply voltage Vcc. Once the power supply voltage Vcc exceeds 1.2 V, the reference voltage Vref becomes constant independent of the power supply voltage Vcc. As described above, according to the first embodiment, the dependency of the reference voltage Vref to the power supply voltage Vcc is small. Further, even when the power supply voltage Vcc is close to the reference voltage Vref, e.g. 1.3 V shown in FIG. 5, the reference voltage Vref can be output, e.g. 1.22 V shown in FIG. 5.

A second embodiment of the present invention is an example in which the third transistor Tr3 and the fourth transistor Tr4 of the current mirror circuit 20 is structured by bipolar transistors. Comparing with FIG. 4 of the first embodiment, the third transistor Tr3 and the fourth transistor Tr4 are PNP bipolar transistors. Other structures are the same as those shown in FIG. 4 of the first embodiment, thus the description thereof are omitted. As shown in the second embodiment, the third transistor Tr3 and the fourth transistor Tr4 can be bipolar transistors. In this case, the bases of the third transistor Tr3 and the fourth transistor Tr4 become control terminals and the collectors thereof as output terminals.

As long as the same function can be obtained as those of the first embodiment and the second embodiment, the first transistor Tr1, the second transistor Tr2, the fifth transistor Tr5, and the sixth transistor Tr6 may be of PNP bipolar transistors. Further, the third transistor Tr3 and the fourth transistor Tr4 may be of n-type FETs or NPN bipolar transistors.

With reference to exemplary embodiments thereof, an electronic circuit is disclosed. The electronic circuit includes a bandgap circuit provided with first and second bipolar transistors that are coupled at a first node and a current mirror circuit provided with third and fourth transistors with respective control terminals coupled at a second node. The electronic circuit further includes a fifth transistor that is bipolar which is coupled to an output terminal of the third transistor where a base of the fifth transistor is coupled to a collector of the second transistor and a sixth transistor that is bipolar that is coupled to an output terminal of the fourth transistor with a base of the sixth transistor coupled to the first node. A control circuit controls a current provided to the bandgap circuit based on an output of the current mirror circuit. A reference voltage output terminal is provided between the control circuit and the bandgap circuit and outputs a reference voltage. According to the present invention, the temperature dependency and power supply voltage dependency of the reference voltage can be suppressed.

In one embodiment, the circuit may be structured such that when a ratio of an emitter area of the fifth transistor to an emitter area of the first transistor is defined as n2, a ratio of an emitter area of the sixth transistor to an emitter area of the first transistor is defined as n1, and a ratio of an output current of the third transistor to an output current of the fourth transistor is defined as n3, an equation of n2=n1×n3 holds true. According to this structure, the current provided to the fifth transistor can be set to a desired current value. In the structure mentioned above, the first transistor and the second transistor may have the same amount of base current. According to this structure, the temperature dependency of the reference voltage can be improved.

In one embodiment, in the circuit discussed above, the second transistor may be a plurality of transistors that have the same configuration as that of the first transistor and are coupled in parallel. According to this structure, the Early effects of the first transistor and the second transistor can be matched, thereby improving the temperature dependency of the reference voltage. In the circuit discussed above, the electronic circuit may also include a first resistor coupled with an emitter of the second transistor, and a second resistor provided between the reference voltage output terminal and a collector of the first transistor, in which the collector of the first transistor is coupled with the first node.

In one embodiment, in the circuit discussed above, a base-emitter voltage of the first transistor and a voltage across both ends of the second resistor may have temperature coefficients of opposite polarity. In one embodiment, the temperature coefficient of the base-emitter voltage of the first transistor and the temperature coefficient of the voltage across both ends of the second resistor may have the same absolute value. In one embodiment, the control circuit may include a seventh transistor with a control terminal thereof being coupled with the output of the current mirror circuit. In one embodiment, the seventh transistor may be of a normally-on transistor. According to this structure, even if the power supply voltage is close to the reference voltage, the temperature dependency and power supply voltage dependency of the reference voltage can be suppressed.

In one embodiment, the circuit of the first and second embodiments can be a part of an electronic system that includes data input circuitry, data storage circuitry, data processing circuitry and data output circuitry.

The foregoing descriptions of specific embodiments have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

The invention claimed is:

1. An electronic circuit comprising:
   a bandgap circuit comprising a first bipolar transistor and a second bipolar transistor wherein the respective bases of the first bipolar transistor and the second bipolar transistor are coupled at a first node;
   a current mirror circuit comprising a third transistor and a fourth transistor, wherein the respective control terminals of the third transistor and the fourth transistor are coupled at a second node, a fifth transistor, that is a bipolar transistor, coupled to an output terminal of the third transistor wherein a base of the fifth transistor is coupled to a collector of the second transistor, and a sixth transistor, that is a bipolar transistor, coupled to an output terminal of the fourth transistor wherein a base of the sixth transistor is coupled to the first node;
   a control circuit that controls a current provided to the bandgap circuit based on an output of the current mirror circuit; and
   a reference voltage output terminal provided between the control circuit and the bandgap circuit and outputting a reference voltage.

2. The electronic circuit according to claim 1, wherein a ratio of an emitter area of the fifth transistor to an emitter area of the first transistor is equal to the ratio of an emitter area of the sixth transistor to an emitter area of the first transistor times a ratio of an output current of the third transistor to an output current of the fourth transistor.

3. The electronic circuit according to claim 2, wherein the first transistor and the second transistor have base currents that are equal in magnitude.

4. The electronic circuit according to claim 3, wherein the second transistor comprises a plurality of transistors that have the same configuration as that of the first transistor and are coupled in parallel.

5. The electronic circuit according to claim 1, the electronic circuit further comprising:
   a first resistor coupled to an emitter of the second transistor; and
   a second resistor provided between the reference voltage output terminal and a collector of the first transistor,
   wherein the collector of the first transistor is coupled to the first node.

6. The electronic circuit according to claim 5, wherein a base-emitter voltage of the first transistor and a voltage across the second resistor have temperature coefficients of opposite polarity.

7. The electronic circuit according to claim 6, wherein the temperature coefficient of the base-emitter voltage of the first transistor and the temperature coefficient of the voltage across the second resistor have the same absolute value.

8. The electronic circuit according to claim 1, wherein the control circuit includes a seventh transistor with a control terminal coupled to the output of the current mirror circuit.

9. The electronic circuit according to claim 8, wherein the seventh transistor is a normally-on transistor.

10. An electronic circuit comprising:
    a bandgap circuit comprising a first bipolar transistor and a second bipolar transistor wherein the respective bases of the first bipolar transistor and the second bipolar transistor are coupled at a first node;
    a current mirror circuit comprising a third transistor and a fourth transistor, that are bipolar transistors, wherein the respective control terminals of the third transistor and the fourth transistor are coupled at a second node, a fifth transistor, that is a bipolar transistor, coupled to an output terminal of the third transistor wherein a base of the fifth transistor is coupled to a collector of the second transistor, and a sixth transistor, that is a bipolar transistor, coupled to an output terminal of the fourth transistor wherein a base of the sixth transistor is coupled to the first node, wherein the collectors of the third and fourth transistor are output terminals;
    a control circuit that controls a current provided to the bandgap circuit based on an output of the current mirror circuit; and
    a reference voltage output terminal provided between the control circuit and the bandgap circuit and outputting a reference voltage.

11. The electronic circuit according to claim 10, wherein a ratio of an emitter area of the fifth transistor to an emitter area of the first transistor is equal to the ratio of an emitter area of the sixth transistor to an emitter area of the first transistor times a ratio of an output current of the third transistor to an output current of the fourth transistor.

12. The electronic circuit according to claim 11, wherein the first transistor and the second transistor have base currents that are equal in magnitude.

13. The electronic circuit according to claim 12, wherein the second transistor comprises a plurality of transistors that have the same configuration as that of the first transistor and are coupled in parallel.

14. The electronic circuit according to claim 10, the electronic circuit further comprising:

a first resistor coupled to an emitter of the second transistor; and
a second resistor provided between the reference voltage output terminal and a collector of the first transistor,
wherein the collector of the first transistor is coupled to the first node.

15. The electronic circuit according to claim 14, wherein a base-emitter voltage of the first transistor and a voltage across the second resistor have temperature coefficients of opposite polarity.

16. The electronic circuit according to claim 15, wherein the temperature coefficient of the base-emitter voltage of the first transistor and the temperature coefficient of the voltage across the second resistor have the same absolute value.

17. The electronic circuit according to claim 10, wherein the control circuit includes a seventh transistor with a control terminal coupled to the output of the current mirror circuit.

18. The electronic circuit according to claim 17, wherein the seventh transistor is a normally-on transistor.

19. An electronic system comprising:
    data input circuitry;
    data storage circuitry;
    data processing circuitry; and
    data output circuitry, wherein said electronic system comprises an electronic circuit comprising:
    a bandgap circuit comprising a first bipolar transistor and a second bipolar transistor wherein the respective bases of the first bipolar transistor and the second bipolar transistor are coupled at a first node;
    a current mirror circuit comprising a third transistor and a fourth transistor, wherein the respective control terminals of the third transistor and the fourth transistor are coupled at a second node, a fifth transistor, that is a bipolar transistor, coupled to an output terminal of the third transistor wherein a base of the fifth transistor is coupled to a collector of the second transistor, and a sixth transistor, that is a bipolar transistor, coupled to an output terminal of the fourth transistor wherein a base of the sixth transistor is coupled to the first node;
    a control circuit that controls a current provided to the bandgap circuit based on an output of the current mirror circuit; and
    a reference voltage output terminal provided between the control circuit and the bandgap circuit and outputting a reference voltage.

20. The electronic system according to claim 19, wherein a ratio of an emitter area of the fifth transistor to an emitter area of the first transistor is equal to the ratio of an emitter area of the sixth transistor to an emitter area of the first transistor times a ratio of an output current of the third transistor to an output current of the fourth transistor.

* * * * *